United States Patent
Schlegel et al.

(10) Patent No.: US 7,319,852 B2
(45) Date of Patent: Jan. 15, 2008

(54) APPARATUS AND METHOD FOR DC OFFSET COMPENSATION IN A DIRECT CONVERSION RECEIVER

(75) Inventors: Nikolai Schlegel, San Diego, CA (US); Christian Holenstein, San Diego, CA (US); Daniel Filipovic, Solana Beach, CA (US); Nitin Kasturi, Los Gatos, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 598 days.

(21) Appl. No.: 10/233,364

(22) Filed: Aug. 29, 2002

(65) Prior Publication Data

US 2004/0043744 A1    Mar. 4, 2004

(51) Int. Cl.
*H04B 1/26* (2006.01)

(52) U.S. Cl. .............. 455/324; 455/158.3; 455/339; 375/319

(58) Field of Classification Search ........ 455/296–298, 455/310, 311, 312, 323–326, 334, 338, 339, 455/313, 158.1, 159.1, 157.1, 158.3; 375/346, 375/355, 319, 356
See application file for complete search history.

(56) References Cited

U.S. PATENT DOCUMENTS

| | | | | | |
|---|---|---|---|---|---|
| 5,003,564 | A | * | 3/1991 | Fling | 377/45 |
| 5,319,679 | A | | 6/1994 | Bagby | 375/106 |
| 5,425,056 | A | | 6/1995 | Maroun et al. | 375/316 |
| 5,459,679 | A | | 10/1995 | Ziperovich | 364/602 |
| 5,670,951 | A | | 9/1997 | Servillio et al. | 340/825 |
| 5,671,256 | A | * | 9/1997 | Clark et al. | 375/342 |
| 5,761,251 | A | * | 6/1998 | Wender | 375/345 |
| 5,896,422 | A | * | 4/1999 | Lu | 375/317 |
| 6,301,312 | B1 | * | 10/2001 | Limberg | 375/326 |
| 6,498,929 | B1 | * | 12/2002 | Tsurumi et al. | 455/296 |

(Continued)

FOREIGN PATENT DOCUMENTS

EP    1235355    8/2002

*Primary Examiner*—Edward F. Urban
*Assistant Examiner*—Nhan T. Le
(74) *Attorney, Agent, or Firm*—Howard H. Seo; Ramin Mobarhan; Thomas R. Rouse

(57) ABSTRACT

An apparatus for coarse compensation of a direct current (DC) offset in a direct to baseband receiver architecture utilizes a serial analog to digital converter (ADC), such as a Delta-Sigma converter, to convert the received signal to digital form. The output of the ADC is sampled for a predetermined number of samples and a counter coupled to the ADC is incremented each time the sample generated by the ADC is a logic one. The counter is not incremented if the sample from the ADC is a logic zero. After the predetermined number of samples is obtained, the counter value is indicative of the DC offset in the received signal. The counter value may be converted by a code converter to a correction value for easy operation of a digital to analog converter (DAC). If the number of samples from the ADC is a power of two, the code converted may be readily implemented by simply inverting the most significant bit (MSB) from the counter to thereby generate a twos complement version of the counter value. The correction value is coupled to the DAC to generate a compensation signal, which is provided to the received signal path in the form of a feedback signal to compensate for the DC offset.

21 Claims, 6 Drawing Sheets

U.S. PATENT DOCUMENTS

| | | | |
|---|---|---|---|
| 6,507,626 B1 * | 1/2003 | Limberg | 375/321 |
| 6,606,359 B1 * | 8/2003 | Nag et al. | 375/348 |
| 6,757,340 B1 * | 6/2004 | Jakobsson | 375/319 |
| 2002/0123320 A1 * | 9/2002 | Lisenbee | 455/296 |
| 2003/0154045 A1 * | 8/2003 | Sung et al. | 702/107 |
| 2003/0199264 A1 * | 10/2003 | Holenstein et al. | 455/324 |

* cited by examiner

APPARATUS AND METHOD FOR DC OFFSET COMPENSATION IN A DIRECT CONVERSION RECEIVER

BACKGROUND

1. Technical Field

The present disclosure is related generally to telecommunications and, more particularly, to a system and method for direct current (DC) offset compensation in a direct to baseband receiver.

2. Description of the Related Art

The conversion of a radio frequency (RF) signal to a baseband signal is part of the normal demodulation process. A conventional radio receiver converts the RF signal to baseband in two separate stages. The RF signal is first down converted to an intermediate frequency (IF) signal. The IF signal is then down converted to the baseband signal. The advantage of conversion to an IF signal is that conventional filtering may be readily employed to remove undesirable signal components. The use of a two-stage process also minimizes the direct current (DC) signal present in the baseband. However, in a mobile telecommunication environment, the additional circuitry associated with the two-stage process is costly and consumes additional electrical power, thus decreasing the useful communication time in a battery-operated device.

A new communication architecture, sometimes referred to as "direct to baseband" or "direct conversation," eliminates the two-stage process by down converting the RF signal directly to baseband in a single step, thus eliminating the need for conversion to an IF. An example of this architecture is illustrated in the functional block diagram of FIG. 1 where a system 10 includes an antenna 12 and a low noise amplifier (LNA) 14. Those skilled in the art will appreciate that the antenna 12 and LNA 14 are designed to operate across an RF range. Other associated circuitry (not shown) selects a predetermined RF channel (i.e., frequency) using, by way of example, filters and other tuning circuitry. Details of the circuitry are known in the art and need not be described herein.

The output of the LNA 14 is coupled to an input of a mixer 16. A local oscillator (LO) 18 is coupled to another input of the mixer 16. As those skilled in the art will appreciate, signal from the LO 18 mixes with the signal from the output of the LNA 14 to produce the baseband output. The output of the mixer 16 is typically coupled to a low-pass filter 20. The circuitry comprising the mixer 16, the LO 18 and the low-pass filter 20 may sometimes be referred to as a direct converter circuit 22. The output of the low-pass filter 20 is coupled to a mobile station modem (MSM) for subsequent decoding.

Those skilled in the art will recognize that other variations of the direct conversion architecture are also possible. For example, a quadrature receiver, such as is common in code division multiple access (CDMA) receivers, has two mixers and two local oscillators that have a quadrature relationship with respect to each other. That is, the local oscillators have a 90° phase relationship with respect to each other. The output of the quadrature mixers are typically identified as an I signal and a Q signal. The quadrature receiver also includes two low-pass filters to independently filter the I and Q signals respectively. The I and Q signals are both passed to the MSM (not shown) for subsequent processing in a known manner.

Although the direct conversion architecture simplifies circuitry, it is not without potential design problems. One of the problems associated with direct conversion architecture is that the output of the direct converter 22 has a high direct current (DC) offset level. These unwanted DC offsets may include static DC levels as well as time-varying DC levels. The sources of static and time-varying DC offsets include circuit mismatch, self-mixing between the LO 18 and the LNA 14, as well as external interference sources. Each of these potential sources of DC offset may vary with gain, frequency, temperature, and other transient operational conditions, such as signal fading. Failure to eliminate DC offsets will result in degraded signal quality, limited dynamic range due to circuit saturation and increased power consumption. Therefore, it can be appreciated that there is a significant need for an apparatus and method to cancel DC offsets in a direct conversion architecture receiver. The techniques described herein achieve this and other advantages as will be apparent from the following detailed description and accompanying figures.

BRIEF SUMMARY

An apparatus and method for direct current (DC) offset compensation is provided for a radio frequency (RF) receiver having a direct converter to permit direct conversion of an RF signal to a baseband signal. The apparatus comprises an analog to digital converter (ADC), having an input coupled to the output of the direct converter, and an ADC output. The ADC output is coupled to a counter to count data samples from the ADC for a predetermined period to generate a count indicative of a DC offset.

In one embodiment, the ADC is a serial ADC. The ADC may be a delta-sigma converter. In one embodiment, the apparatus further comprises a code converter coupled to a counter to generate an offset correction value based on the count indicative of the DC offset. In one embodiment the counter is permitted to count a predetermined number of samples with the predetermined number being a power of two. For example, the counter may be enabled to permit a count of 64 samples from the ADC. In one embodiment, a code converter is an inverter to invert the most significant bit (MSB) from the counter to thereby generate an offset correction value.

The apparatus may further comprise a digital to analog converter (DAC) coupled to the counter to generate an analog offset correction value based on the count indicative of the DC offset.

BRIEF DESCRIPTION OF THE DRAWING(S)

DETAILED DESCRIPTION

Figure 1:
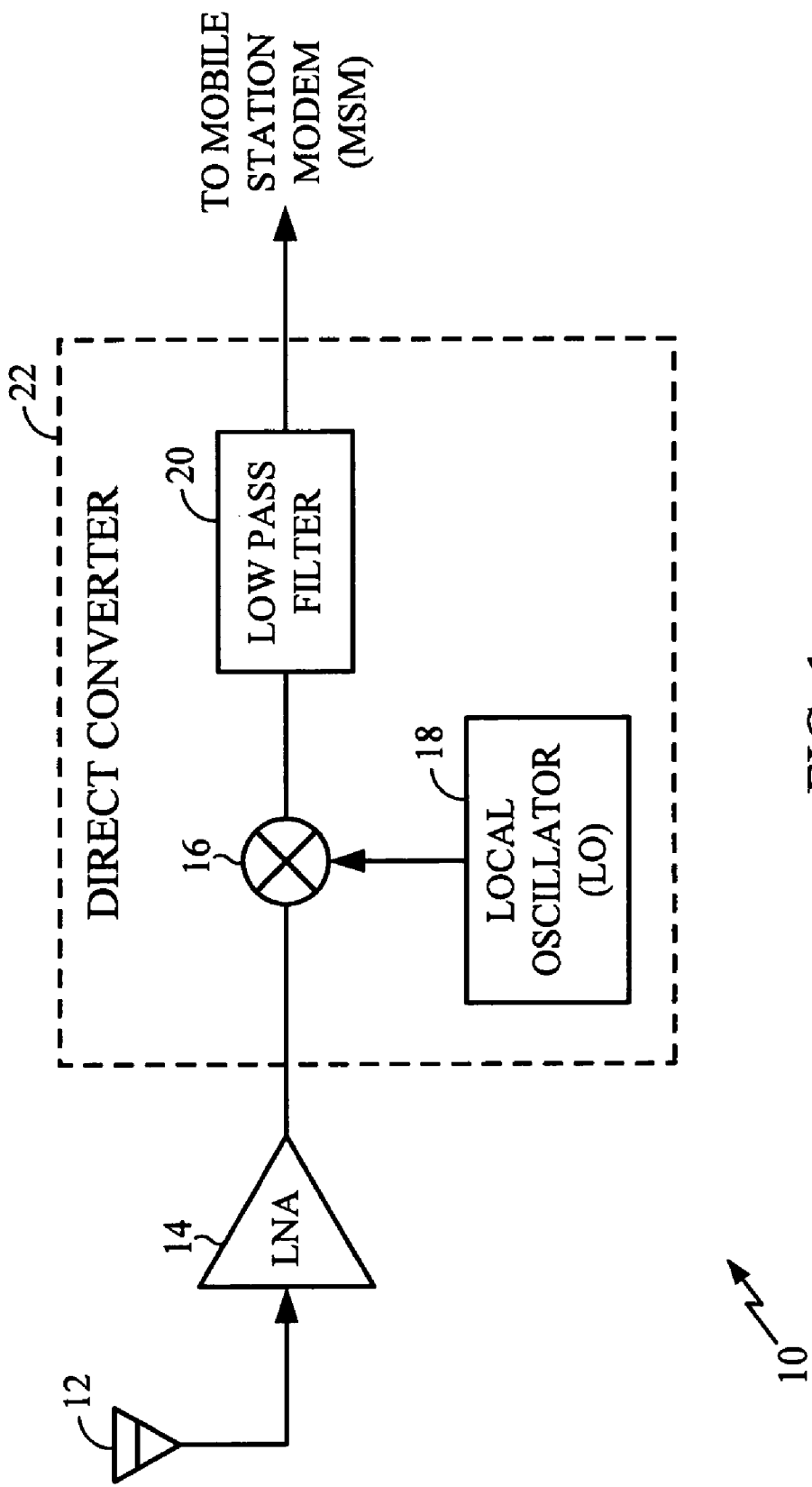
FIG. 1 is a functional block diagram of a conventional direct-to-baseband receiver architecture.
Figure 2:
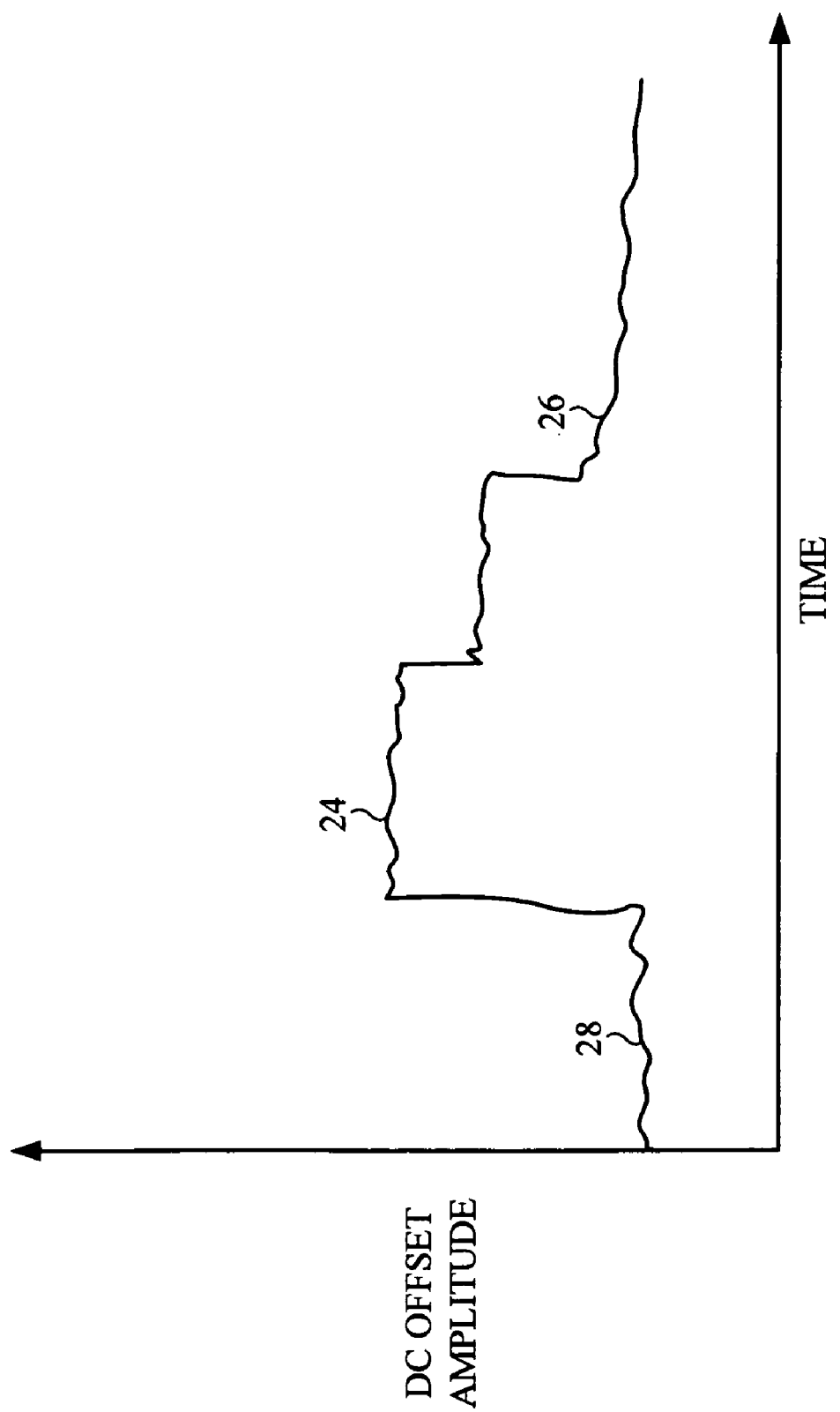
FIG. 2 is a sample waveform illustrating DC offsets resulting from a direct-to-baseband receiver architecture.

As previously discussed, direct current (DC) offsets a serious problem in a direct-to-baseband receiver architecture. The DC offset may be fixed or time-varying. The waveform of FIG. 2 illustrates the DC offset problems that may be encountered by a direct-to-baseband receiver. A portion 22 of the waveform is essentially a fixed DC offset amplitude that includes some small time-varying component. A typical receiver includes a variable gain amplifier (not shown), which has a gain control input to alter the gain in a step-wise fashion. A portion 24 of the waveform in FIG. 2 illustrates the abrupt change in DC offset amplitude that results from a sudden change in the gain setting of the variable gain amplifier. Finally, a portion 26 of the waveform in FIG. 2 illustrates a slowly changing DC offset amplitude.

The amplitude of the DC offset may be related to the gain setting within the receiver. The abrupt change in DC offset results from gain changes in the variable-gain amplifier. Time-varying components of the DC offset may be caused by variations in temperature, receive frequency and/or signal fading. Temperature changes typically result in a slow change in the DC offset. Changes in DC offset due to frequency are the result of changes in the receive frequency. DC offset changes due to signal fading are based on the Doppler effect that produces time-varying DC offset with frequency components of up to twice the Doppler frequency. The DC offset must be controlled for satisfactory operation of the direct-to-baseband receiver.

As will be described in greater detail herein, a receiver built in accordance with the present disclosure has a very fast coarse grain DC offset cancellation circuit. A receiver built in accordance with the present disclosures embodied in a system 100 illustrated in the functional block diagram of FIG. 3. The system 100 includes a central processing unit (CPU) 102, which controls operation of the system. Those skilled in the art will appreciate that the CPU 102 is intended to encompass any processing device capable of operating the telecommunication system. This includes microprocessors, embedded controllers, application-specific integrated circuits (ASICs), digital signal processors (DSPs), state machines, dedicated discrete hardware, and the like. The present invention is not limited by the specific hardware component selected to implement the CPU 102.

The system also includes a memory 104, which may include both read-only memory (ROM) and random access memory (RAM). The memory 104 provides instructions and data to the CPU 102. A portion of the memory 104 may also include nonvolatile random access memory.

The system 100 is typically implemented as part of a wireless communication device, such as a cellular telephone, and includes a transmitter 108 and a receiver 110 to allow transmission and reception of data, such as audio communications, between the system 100 and the remote location. The transmitter 108 and receiver 110 may be combined into a transceiver 112. An antenna 114 is electrically coupled to the transceiver 112. The operation of the transmitter 108, receiver 110 and antenna 114 are well known in the art and need not be described herein except as the operation of the receiver relates specifically to the present invention.

The system 100 also includes a counter 120 and a count enable circuit 122. The counter 120 generates a count indicative of a DC offset value. The operation of the counter 120 and count enable circuit 122 are described in greater detail below.

A code converter 124 may be used to convert the count data from the counter 120 to an offset correction value based on the count data. A digital-to-analog converter (DAC) 126 generates an analog correction signal, which is provided to the receiver 110 to correct for DC offset.

The various components of the system 100 are coupled together by a bus system 128, which may include a power bus, a control signal bus, and a status signal bus in addition to a data bus. Those skilled in the art will recognize that the bus system 128 may also include internal buses associated with, by way of example, the CPU 102 or the memory 104. However, for the sake of clarity, the various buses are illustrated in FIG. 3 as the bus system 128.

Figure 3:
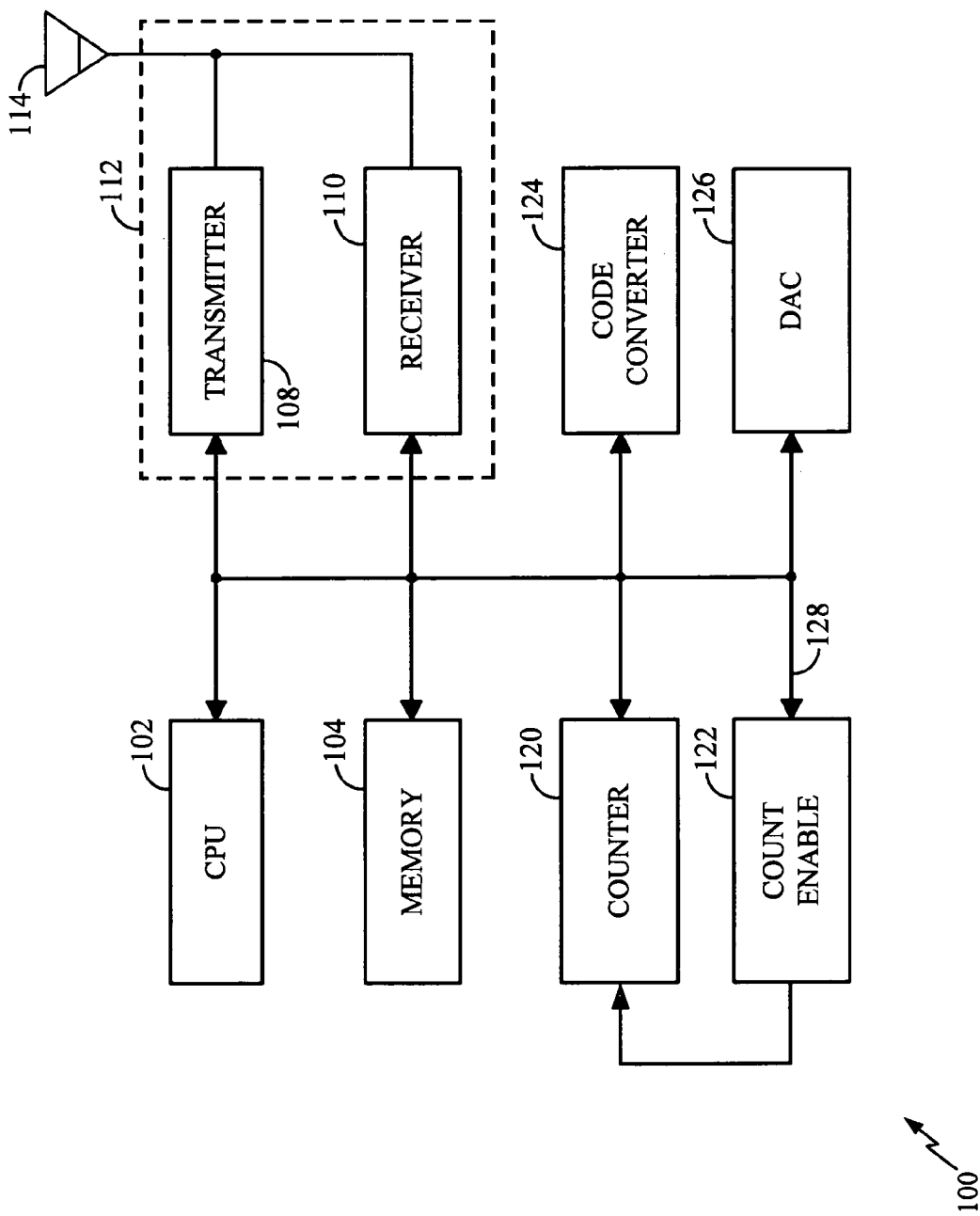
FIG. 3 is a functional block diagram of a receiver architecture constructed in accordance with the present disclosure.

One skilled in the art will appreciate that the system 100 illustrated in FIG. 3 is a functional block diagram rather than a listing of specific components. For example, although the counter 120, count enable circuit 122 and code converter 124 are illustrated as three separate blocks within the system 100, they may be, in fact, embodied in one physical component, such as a digital signal processor (DSP) used to implement the CPU 102. They may also reside as program codes in the memory 104, such code being operated on by the CPU 102. The same considerations apply to other components listed in the system 100 of FIG. 3.

Figure 4:
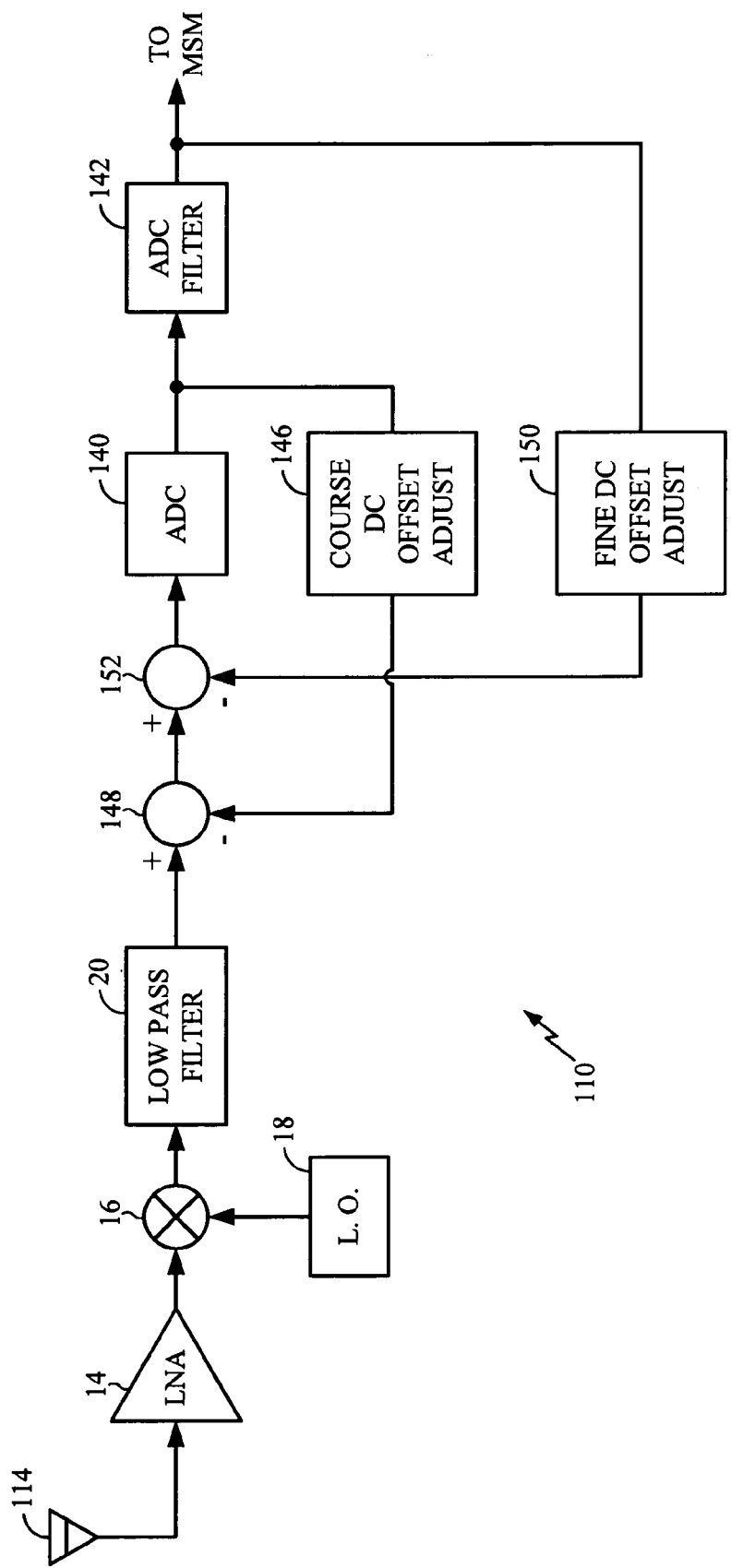
FIG. 4 is a functional block diagram illustrating the operation of a receiver built in accordance with the description provided herein.

The operation of the system 100 may be better understood with respect to the block diagram of FIG. 4, which illustrates the signal flow within the receiver 110. The antenna 114 detects electromagnetic energy, which is coupled to the LNA 14. The output of the LNA 14 is coupled to the mixer 16, as is known in the art. The LO 18 is also coupled to the mixer 16 and generates an output signal at baseband. The baseband output signal is coupled to the low-pass filter 20.

In a conventional circuit, the output of the low-pass filter is coupled to an analog-to-digital converter (ADC) 140. In an exemplary embodiment, the ADC 140 is a one-bit serial ADC. For example, a Delta-Sigma serial ADC may be used. The output of the ADC 140 is coupled to an ADC filter 142. In a typical implementation, the ADC filter 142 may be implemented as a Delta-Sigma low-pass filter.

In a conventional DC offset correction circuit, the DC offset is measured at the output of the DC filter 142 and further processed to generate a DC offset correction signal. The drawback of this approach is the response time of the correction circuit. Because the ADC filter 142 has a relatively long response time, the DC offset correction circuit is a relatively long response time. This approach may be particularly problematic when abrupt changes in the DC offset signal amplitude are experienced, such as when the gain of the receiver 110 is changed. In a conventional implementation, a coarse DC offset adjustment circuit may be combined with a fine DC offset adjustment circuit to provide a combined DC offset correction signal.

In sharp contrast to the conventional approach, the system 100 provides a measure of DC offset directly from the output of the ADC 140. This eliminates the slow response time resulting from operation of the ADC filter 142. A coarse DC offset adjustment circuit 146 is coupled to the out of the ADC 140 and derives a measure of the DC offset signal amplitude. The output of the coarse DC offset adjustment circuit 146 is coupled to an adder 148 to effectively cancel out of the DC offset signal. Thus, the DC offset adjustment circuit 146 generates a compensation or correction signal to at least partially cancel the effects the DC offset in the received signal.

It should be noted that other conventional circuitry may be used to provide a fine DC offset adjustment. As illustrated in the block diagram of FIG. 4, a fine DC offset adjustment circuit 150 provides the fine offset adjustment. The operation of these fine DC offset adjustments is known in the art and need not be described in greater detail herein. The output of the fine DC offset adjustment circuit 150 is coupled to the imput of the ADC 140 via an adder 152.

Figure 5:
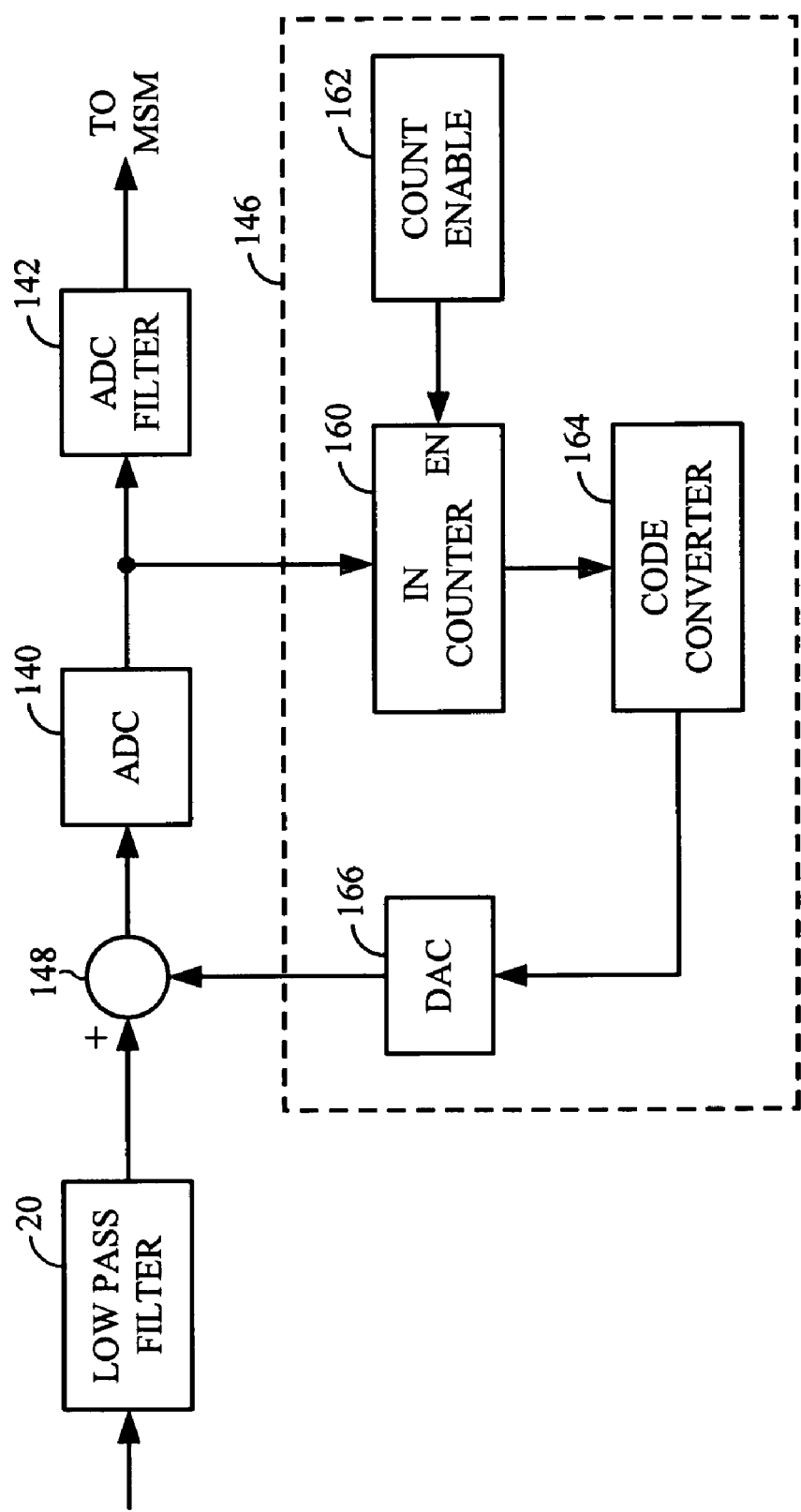
FIG. 5 is a detailed functional block diagram illustrating the operation of a coarse DC offset adjustment circuit built in accordance with the description provided herein.

The operation of the coarse DC offset adjustment may now be explained in greater detail with respect to FIG. 5. For the sake of clarity, the fine DC offset adjustment circuit 150 (see FIG. 4) is not illustrated in FIG. 5 since it operates independently of the coarse DC offset techniques disclosed herein. The coarse DC offset adjustment circuit 146 may be implemented by an N-bit counter 160, which is controlled by a count enable circuit 162. The counter 160 has an input coupled to the output of the ADC 140 and counts for a period of time controlled by the count enabled circuit 162. When the ADC 140 is a serial ADC, such as a Delta-Sigma ADC Converter, the serial output line is coupled to a counter input line on the counter 160. Each time the ADC produces a Logic 1 output value, the counter 160 is incremented. At the end of the count-enabled period, the value in the counter 160 is coupled to a code converter 164, which in turn is coupled to a digital-to-analog converter (DAC) 166. The output of the DAC 166 is coupled to the adder 148, as described above.

In a simplified implementation of the coarse DC offset adjustment circuit 146, the count enable circuit 162 enables the counter 160 for a predetermined number of samples from the ADC 140. It has been determined that it is convenient to use a binary power of samples. That is, enabling the counter 160 for a number of samples equal to a power of two allows a simple implementation of the code converter 164.

Those killed in the art will recognize that the selection of the actual number of sample measured by the counter 160 may be system-dependent. It has been found that too few samples will result in overshoot and undershoot of the correction signal. If too many samples are taken, the system response slows down to an unacceptable level. In practice, it has been found that 64 samples from the ADC 140 provide a good sample range, but does not slow the loop response time to an unacceptable level.

Assuming, for the sake of convenience, that 64 samples are taken from the ADC 140, the counter 160 increments its count value each time a logic value of 1 is generated by the ADC. Examples of operation of the coarse DC offset adjustment circuit 146 would be helpful. Several examples of counter values and corresponding code correction values are illustrated in Table 1 below.

TABLE 1

| Samples | | Counter Value | Code Correction Value |
|---|---|---|---|
| Logic 0 | Logic 1 | | |
| 32 | 32 | 100000 | 000000 |
| 48 | 16 | 010000 | 110000 |
| 16 | 48 | 110000 | 010000 |
| 64 | 0 | 000000 | 100000 |
| 0 | 64 | 111111 | 011111 |

As can be seen from the data in Table 1, the coarse DC offset adjustment circuit 146 may be easily implemented and provides a fast response to correct DC offsets in the received signal because it is coupled directly to the output of the ADC 140 and is not slowed by any filter response time (e.g., the response of the ADC filter 142).

In one example where the ADC 140 produces 64 evenly distributed values (i.e., 32 values having a logic one and 32 values having a logic 0) the output of the counter 160 will be binary 32 (i.e., a binary value of 100000). The code converter 164 may convert this logic value to a twos complement version for use with the DAC 166. In an implementation where the counter 160 is enabled for a power of two samples (e.g., 64 samples), the code converter 164 may be implemented simply as an inverter to invert the logic value of the most significant fit (MSB) from the counter. In the example above where the counter value is 100000, inversion of the MSB results in a correction value of 000000. Thus, the DAC 166 would not generate any correction voltage, which is appropriate since the ADC 140 produced an equal numbers of 0s and 1s.

In another example, consider that the ADC 140 generated 64 samples in which 16 samples have a logic value of 1 and 48 samples have a logic value of 0. In this example, the counter 160 would generate a count of binary 16 (i.e., 010000). Again, the code converter 164 inverts the MSB to generate a binary correction value of 110000 (i.e., a negative binary 16). This value is provided to the DAC 166, which generates a correction signal coupled into the system via the adder 148.

In yet another example, where the 64 samples from the ADC 140 result in 48 samples having a logic 1 and 16 samples having a logic 0, the binary output of the counter 160 is 110000. The code converter 164 inverts the MSB to generate a binary correction value of 010000 (i.e., a positive binary 16). This value is provided to the DAC 166, which generates the necessary correction signal coupled into the system via the adder 148.

In yet another example, where the 64 samples from the ADC 140 result in all samples having a logic 1 and no samples having a logic 0, the output of the counter 160 would be binary 64. Those skilled in the art will appreciate that it takes 7 data bits to represent binary 64. However, it is convenient to limit the number of bits in the counter to simplify the design and implementation. Accordingly, in this uncommon case, the counter 160 is limited in its count to a binary output of 111111 (i.e., binary 63). The code converter 164 inverts the MSB to generate a binary correction value of 011111 (i.e., a positive binary 31). This value is provided to the DAC 166, which generates the necessary correction signal coupled into the system via the adder 148. In the case where none of the 64 samples has a logic 1 value, the output of the counter 160 is 000000 (i.e., binary 0). Following inversion of the MSB by the code converter 164, the binary correction value is 100000 (i.e., a negative binary 32). Those skilled in the art will recognize that the examples provided herein are intended to illustrate operation of the system 100 and are not intended as limitations. Other count lengths and code correction values can be used to satisfactorily implement the system 100.

Figure 6:
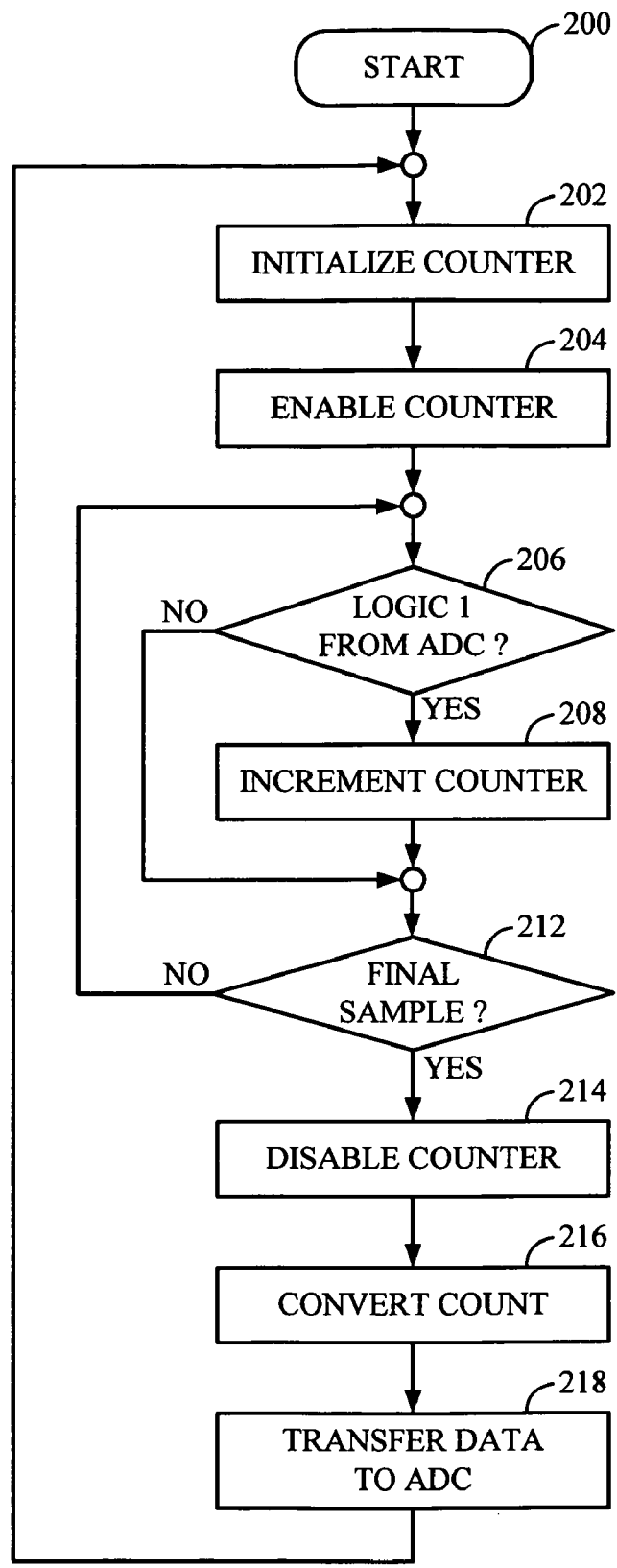
FIG. 6 is a flowchart operating illustrating the operation of a receiver build in accordance with the description contained herein.

The operation of the system 100 is illustrated in the flowchart of FIG. 6. At a start 200, the system 100 is under power and operational. In step 202, the system 100 initializes the counter 160. Initialization includes resetting the counter 160, and may also involve allocating registers in the CPU 102 (see FIG. 3) or the memory 104 for use as the counter. In step 204, the counter 160 is enabled.

In decision 206, the system 100 tracks samples generated by the ADC 160 (see FIG. 4). If the ADC 160 generates a logic one, the result of decision 208 is YES. In that case, the system increments the counter 160 in step 208. If the ADC 160 generates a logic zero, the result of decision 208 is NO and the counter 160 is not incremented.

In decision 212, the system 100 determines if the sample just received is the final sample. As noted above, a convenient implementation of the system 100 will use a number of samples that corresponds to a power of two. This permits simple implementation of the code converter 164. However, satisfactory operation of the system 100 can be achieved using another number of samples. Furthermore, if a power of two samples is selected, the system 100 is not limited to 64 samples as described in the examples above.

If the current sample is not the final sample, the result of decision 212 is NO and the system 100 returns to decision 206 to analyze the next sample from the ADC 160. If the current sample is the final sample, the result of decision 212 is YES. In that event, the system 100 disables the counter in step 214 and converts the counter value in step 216. In step 218 the output of the code converter 164 is transferred to the DAC 166 and the system 100 returns to step 202 to reinitialize the counter. The initialization at this point may simply involve resetting the counter 160. Thus, the system 100 provides a fast coarse DC offset compensation system.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. An apparatus for DC offset compensation in a radio frequency (RF) receiver having a direct converter to permit direct down conversion of an RF signal to a baseband signal, the apparatus comprising:
    an analog to digital convener (ADC) having an input coupled to the output of the direct converter and an output; and
    a counter coupled to the output of the ADC to count occurrences of a particular logic value in data samples from the ADC for a predetermined period of time and thereby generate a count indicative of a DC offset.

2. The apparatus of claim 1, further comprising a code converter coupled to the counter to thereby generate an offset correction value based on the count indicative of the DC offset.

3. The apparatus of claim 2 wherein the counter is enabled to permit a predetermined number of samples, the predetermined number being a power of two.

4. The apparatus of claim 3 wherein the code converter is an inverter to invert the most significant bit (MSB) from the counter to thereby generate the offset correction value.

5. The apparatus of claim 2, further comprising a digital to analog converter (DAC) coupled to the counter to generate an analog offset correction value based on the count indicative of the DC offset.

6. The apparatus of claim 1 wherein the ADC is a serial ADC.

7. The apparatus of claim 1 wherein the ADC is a delta-sigma converter.

8. An apparatus for DC offset compensation in a radio frequency (RF) receiver having a direct converter to permit direct down conversion of an RF signal to a baseband signal, the apparatus comprising:
    an analog to digital converter (ADC) having an input coupled to the output of the direct converter and an output;
    a filter having an input coupled to the output of the ADC and a filter output; and
    a counter coupled to the output of the ADC to count occurrences of a particular logic value in data samples from the ADC for a predetermined period of time and thereby generate a count indicative of a DC offset.

9. The apparatus of claim 8, further comprising a code converter coupled to the counter to thereby generate an offset correction value based on the count indicative of the DC offset.

10. The apparatus of claim 9 wherein the counter is enabled to permit a predetermined number of samples, the predetermined number being a power of two.

11. The apparatus of claim 10 wherein the code converter is an inverter to invert the most significant bit (MSB) from the counter to thereby generate the offset correction value.

12. An apparatus for DC offset compensation in a radio frequency (RF) receiver having a direct converter to permit direct down conversion of an RE signal to a baseband signal, the apparatus comprising:
    conversion means for convening an analog signal to a digital signal, the conversion means having an input coupled to the output of the direct converter at an output generating an unfiltered output signal; and
    means for counting configured to receive the unfiltered output signal and to count data samples therefrom for a predetermined period of time to thereby generate a count indicative of a DC offset.

13. The apparatus of claim 12, further comprising conversion means coupled to the means for counting to thereby generate an offset correction value based on the count indicative of the DC offset.

14. The apparatus of claim 12 wherein the means for counting is enabled to permit a predetermined number of samples, the predetermined number being a power of two.

15. The apparatus of claim 14 wherein the conversion means is an inverter to invert the most significant bit (MSB) from the means for counting to thereby generate the offset correction value.

16. The apparatus of claim 12, further comprising digital conversion means for converting a digital signal to an analog signal, the digital conversion means being coupled to the means for counting to generate an analog offset correction value based on the count indicative of the DC offset.

17. A method for DC offset compensation in a radio frequency (RF) receiver having a direct converter to permit direct down conversion of an RF signal to a baseband signal, the method comprising:
converting an analog baseband signal to a digital signal to thereby generate an unfiltered output signal; and
counting data samples from the unfiltered output signal for a predetermined period of time to thereby generate a count indicative of a DC offset.

18. The method of claim 17, further comprising convening the count indicative of the DC offset to thereby generate an offset correction value based on the count indicative of the DC offset.

19. The method of claim 17 wherein counting data samples is enabled to permit counting a predetermined number of samples, the predetermined number being a power of two.

20. The method of claim 19 further comprising inverting the most significant bit (MSB) of the count indicative of the DC offset to thereby generate an offset correction value based on the count indicative of the DC offset.

21. The method of claim 17, further comprising converting the count indicative of the DC offset to an analog signal to generate an analog offset correction value based on the count indicative of the DC offset.

* * * * *